(12) United States Patent
Takamine

(10) Patent No.: US 10,644,674 B2
(45) Date of Patent: May 5, 2020

(54) MULTIPLEXER, RADIO-FREQUENCY FRONT-END CIRCUIT, AND COMMUNICATION DEVICE

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 21 days.

(21) Appl. No.: 16/218,532

(22) Filed: Dec. 13, 2018

(65) Prior Publication Data

US 2019/0123721 A1   Apr. 25, 2019

Related U.S. Application Data

(63) Continuation of application No. PCT/JP2017/016746, filed on Apr. 27, 2017.

(30) Foreign Application Priority Data

Jun. 28, 2016   (JP) .................. 2016-128184

(51) Int. Cl.
  *H03H 9/72*   (2006.01)
  *H03H 9/64*   (2006.01)
  (Continued)

(52) U.S. Cl.
  CPC .......... *H03H 9/72* (2013.01); *H03H 9/02992* (2013.01); *H03H 9/145* (2013.01);
  (Continued)

(58) Field of Classification Search
  CPC .. H03H 9/6496; H03H 9/02992; H03H 9/145; H03H 9/14502; H03H 9/14541; H03H 9/64; H03H 9/6406; H03H 9/72
  (Continued)

(56) References Cited

U.S. PATENT DOCUMENTS

2011/0215883 A1   9/2011   Fujiwara et al.
2016/0156334 A1*  6/2016   Nakagawa ........... H03H 9/6469
                                                              333/133

(Continued)

FOREIGN PATENT DOCUMENTS

JP   2011-182220 A   9/2011
JP   2012-028896 A   2/2012
(Continued)

OTHER PUBLICATIONS

Official Communication issued in International Patent Application No. PCT/JP2017/016746, dated Jun. 20, 2017.

*Primary Examiner* — Benny T Lee
*Assistant Examiner* — Hafizur Rahman
(74) *Attorney, Agent, or Firm* — Keating & Bennett, LLP

(57) ABSTRACT

A quadplexer includes a first filter and a second filter having a pass band frequency that is higher than a pass band frequency of the first filter. The first filter includes series resonators disposed on a first path and parallel resonators disposed on a path that connects the first path and a ground to each other. A direction that connects ends of a plurality of electrode fingers defining each resonator crosses an elastic wave propagation direction at a predetermined angle. The series resonator nearest to a common terminal does not include first electrode fingers, and the other series resonators include the first electrode fingers.

20 Claims, 8 Drawing Sheets

(51) Int. Cl.
*H03H 9/145* (2006.01)
*H03H 9/02* (2006.01)

(52) U.S. Cl.
CPC .... *H03H 9/14502* (2013.01); *H03H 9/14541* (2013.01); *H03H 9/64* (2013.01); *H03H 9/6406* (2013.01); *H03H 9/6496* (2013.01)

(58) Field of Classification Search
USPC ................................................ 333/193, 133
See application file for complete search history.

(56) References Cited

U.S. PATENT DOCUMENTS

| 2016/0182010 A1 | 6/2016 | Nakamura et al. |
| 2016/0261038 A1 | 9/2016 | Tanaka |
| 2017/0047905 A1 | 2/2017 | Araki et al. |

FOREIGN PATENT DOCUMENTS

| JP | 2016-119569 A | 6/2016 |
| WO | 2015/064238 A1 | 5/2015 |
| WO | 2015/182522 A1 | 12/2015 |

\* cited by examiner

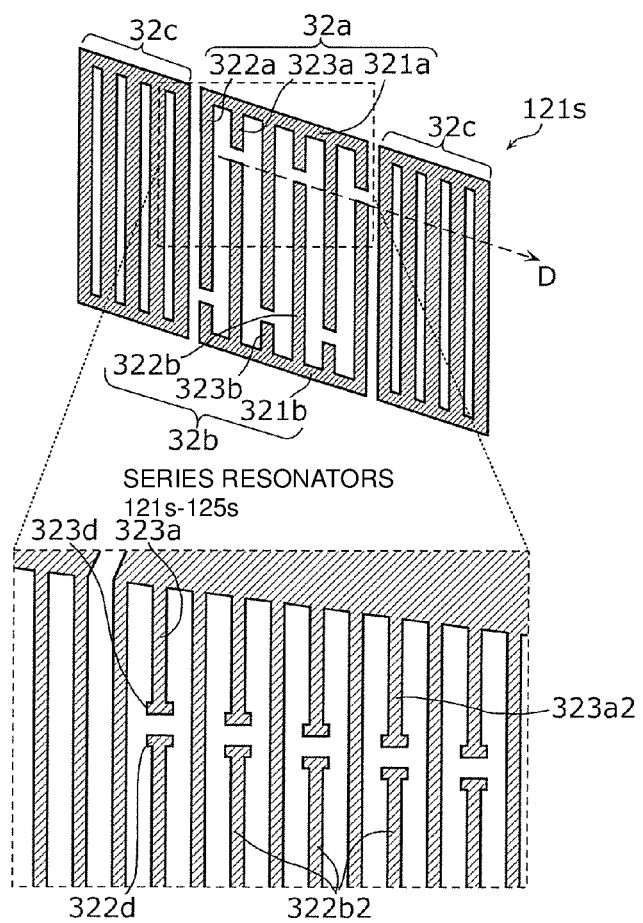

RESONANCE CHARACTERISTIC OF SERIES RESONATOR 121s

REFLECTION CHARACTERISTIC OF SERIES RESONATOR 121s

MULTIPLEXER, RADIO-FREQUENCY FRONT-END CIRCUIT, AND COMMUNICATION DEVICE

CROSS REFERENCE TO RELATED APPLICATIONS

This application claims the benefit of priority to Japanese Patent Application No. 2016-128184 filed on Jun. 28, 2016 and is a Continuation Application of PCT Application No. PCT/JP2017/016746 filed on Apr. 27, 2017. The entire contents of each application are hereby incorporated herein by reference.

BACKGROUND OF THE INVENTION

1. Field of the Invention

The present invention relates to a multiplexer, a radio-frequency (RF) front-end circuit, and a communication device.

2. Description of the Related Art

In recent years, band separators for splitting (separating) an RF signal into frequency bands have been widely used in communication devices, such as cellular phone terminals, so that a single terminal supports a plurality of frequency bands and a plurality of radio systems, that is, multiband and multimode operations. For such a band separator, there has been proposed a configuration in which two duplexers are combined into a quadplexer, each duplexer including a transmission filter and a reception filter (see, for example, Japanese Unexamined Patent Application Publication No. 2012-028896).

In a multiplexer, such as a quadplexer having the foregoing configuration, paths running through the individual filters are connected to each other and accordingly the characteristics of one filter may have an influence on the characteristics of another filter. Thus, the characteristics of one filter that do not affect the one filter may become a factor that degrades the characteristics of another filter. Specifically, a stop-band ripple (a ripple generated in a stop band) of one filter does not have an influence on the characteristics in the pass band of the one filter. However, if the frequency at which the stop-band ripple is generated is within the pass band of another filter, this may become a factor that increases a ripple in the pass band (a pass-band ripple) of the other filter.

SUMMARY OF THE INVENTION

Preferred embodiments of the present invention provide multiplexers, RF front-end circuits, and communication devices that are each capable of reducing or preventing a ripple in a pass band.

A multiplexer according to a preferred embodiment of the present invention includes a common terminal, a first terminal, and a second terminal; a first filter disposed on a first path that connects the common terminal and the first terminal to each other; and a second filter disposed on a second path that connects the common terminal and the second terminal to each other, the second filter having a pass band frequency that is higher than a pass band frequency of the first filter. The first filter includes two or more series resonators disposed on the first path, and one or more parallel resonators disposed on a path that connects the first path and a ground to each other. Each of the two or more series resonators and the one or more parallel resonators includes an IDT (interdigital transducer) electrode and a reflector that are provided on a substrate including a piezoelectric layer, the IDT electrode including a pair of comb-teeth electrodes. Each of the pair of comb-teeth electrodes included in each of the two or more series resonators is defined by a plurality of electrode fingers disposed so as to extend in a direction orthogonal or substantially orthogonal to an elastic wave propagation direction, and a busbar electrode that connects one end of each of the plurality of electrode fingers to one another. A direction that connects other ends of the plurality of electrode fingers to one another crosses the elastic wave propagation direction. The IDT electrode included in each of the two or more series resonators includes at least one of a first electrode finger and a second electrode finger among the plurality of electrode fingers, each first electrode finger having a width that is larger at the other end than at a central portion, each second electrode finger having a width that is smaller at the other end than at a central portion or that is the same or substantially the same at both of the other end and the central portion. A ratio of the number of the second electrode fingers to the number of the plurality of electrode fingers included in a series resonator nearest to the common terminal among the two or more series resonators is higher than a ratio of the number of the second electrode fingers to the number of the plurality of electrode fingers included in each of the other one or more series resonators among the two or more series resonators.

In a one-port resonator that includes a piezoelectric layer and that uses surface acoustic waves, a transverse-mode ripple is generated between a resonant frequency and an anti-resonant frequency, which may degrade the transmission characteristic in the pass band. As measures against this, a slanted IDT is provided in which a direction that connects ends of electrode fingers defining a comb-teeth electrode of an IDT electrode crosses an elastic wave propagation direction. In addition, to further reduce insertion loss in the pass band, variant fingers are provided together with the slanted IDT. Each variant finger has a width that is larger at an end of the finger than at a central portion of the finger.

The inventor of preferred embodiments of the present invention has discovered the following. That is, in the one-port first filter that includes a slanted IDT and variant fingers and that uses surface acoustic waves, if a ratio of the number of variant fingers to the total number of electrode fingers included in a series resonator nearest to a common terminal of the first filter is lower than a ratio of the number of variant fingers to the total number of electrode fingers included in each of the other series resonators, a ripple in the pass band of the second filter is able to be reduced or prevented. Accordingly, a ripple in the pass band of the second filter is able to be reduced or prevented without degrading the filter characteristics of the first filter, compared to a case in which the proportion of variant fingers is the same in all of the series resonators defining the first filter.

The number of the first electrode fingers included in the series resonator nearest to the common terminal among the two or more series resonators may be smaller than the number of the first electrode fingers included in each of the other one or more series resonators.

With this configuration, the proportion of variant fingers in the series resonator nearest to the common terminal of the first filter is lower than the proportion of variant fingers in each of the other one or more series resonators. In addition, the number of variant fingers included in the series resonator nearest to the common terminal of the first filter is smaller than the number of variant fingers included in each of the other one or more series resonators. Accordingly, a ripple in the pass band of the second filter is able to be effectively reduced or prevented even if electrode parameters, such as the number of pairs and an intersecting width, vary among the individual IDT electrodes defining the individual series resonators.

The IDT electrode of the series resonator nearest to the common terminal among the two or more series resonators may not include the first electrode fingers, and the IDT electrode of each of the other one or more series resonators may include the first electrode fingers.

Accordingly, a ripple in the pass band of the second filter is able to be reduced or prevented more effectively.

The first filter may have a ladder filter structure defined by the two or more series resonators and the one or more parallel resonators.

Accordingly, a ripple in the pass band of the second filter is able to be reduced or prevented while acquiring a low-loss characteristic of the first filter.

The first filter may further have a longitudinally coupled filter structure disposed on the first path.

Accordingly, it is possible to achieve required filter characteristics, for example, attenuation enhancement.

The substrate may include the piezoelectric layer including one main surface on which the IDT electrode is provided, a high-acoustic-velocity supporting substrate through which a bulk wave propagates at an acoustic velocity higher than an acoustic velocity of an elastic wave that propagates through the piezoelectric layer, and a low-acoustic-velocity film through which a bulk wave propagates at an acoustic velocity lower than an acoustic velocity of an elastic wave that propagates through the piezoelectric layer, the low-acoustic-velocity film being disposed between the high-acoustic-velocity supporting substrate and the piezoelectric layer.

Accordingly, a Q value of each resonator including the IDT electrode provided on the substrate including the piezoelectric layer is able to be maintained at a large value.

The multiplexer may include a first duplexer and a second duplexer, the first duplexer including two filters including the first filter, the second duplexer including two filters including the second filter.

Accordingly, a ripple in the pass band is able to be reduced or prevented in the multiplexer including the plurality of duplexers.

The first filter may have a pass band that is an uplink frequency band in Band 3 of Long Term Evolution (LTE), and the second filter may have a pass band that is an uplink frequency band in Band 1 of the LTE.

In a case in which the first filter has a pass band that is an uplink frequency band in Band 3 of the LTE and the second filter has a pass band that is an uplink frequency band in Band 1 of the LTE, a ripple in the pass band of the second filter is likely to increase. Thus, with the series resonator nearest to the common terminal of the first filter having the above-described structure, an increase in the ripple is able to be effectively reduced or prevented.

A radio-frequency front-end circuit according to a preferred embodiment of the present invention includes a multiplexer described above and an amplification circuit connected to the multiplexer.

Accordingly, a radio-frequency front-end circuit capable of reducing or preventing a ripple in a pass band is able to be provided.

A communication device according to a preferred embodiment of the present invention includes a radio-frequency signal processing circuit that processes a radio-frequency signal that is transmitted and received by an antenna element, and a radio-frequency front-end circuit described above that transmits the radio-frequency signal between the antenna element and the radio-frequency signal processing circuit.

Accordingly, a communication device capable of reducing or preventing a ripple in a pass band is able to be provided.

Preferred embodiments of the present invention are each capable of reducing or preventing a ripple in a pass band.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5B is a plan view of an IDT electrode of a filter on a low-frequency side according to a Comparative Example.

DETAILED DESCRIPTION OF THE PREFERRED EMBODIMENTS

Figure 1:
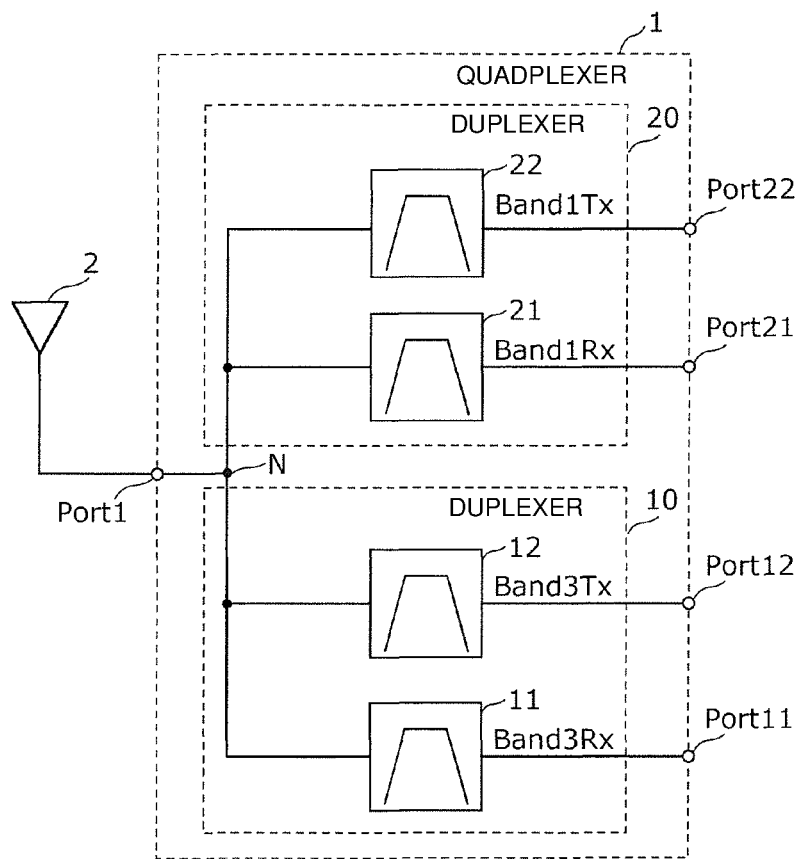
FIG. 1 is a configuration diagram of a quadplexer according to a first preferred embodiment of the present invention.

Hereinafter, preferred embodiments of the present invention will be described in detail with reference to the accompanying drawings. Each preferred embodiment described below includes general or specific examples. The values, the shapes, the materials, the elements, and the arrangement and connection configuration of the elements described in the following preferred embodiments are examples and do not limit the present invention. Among the elements described in the following preferred embodiments, an element that is not described in an independent claim will be described as an optional element. The sizes or the ratios in size of the elements illustrated in the drawings are not always exact. In the individual figures, elements that are the same or substantially the same are denoted by the same reference numerals, and a repetitive description may be omitted or simplified. In the following preferred embodiments, "connected" includes not only "directly connected" but also "electrically connected with another element or component interposed therebetween".

First Preferred Embodiment

In a first preferred embodiment of the present invention, a quadplexer will be described as an example of a preferred multiplexer.

FIG. 1 is a configuration diagram of a quadplexer 1 according to the present preferred embodiment. FIG. 1 also illustrates an antenna element 2 that is connected to a common terminal Port1 of the quadplexer 1.

The quadplexer 1 is a multiplexer (band separator) that includes a plurality of filters (here, four filters 11, 12, 21, and 22) having different pass bands and that includes a common terminal Port1 defining and functioning as antenna-side terminals of the plurality of filters.

Specifically, as illustrated in FIG. 1, the quadplexer 1 includes the common terminal Port1, four individual terminals Port11, Port12, Port21, and Port22, and the four filters 11, 12, 21, and 22.

The common terminal Port1 is commonly provided for the four filters 11, 12, 21, and 22 and is connected to these filters 11, 12, 21, and 22 in the inner side of the quadplexer 1. In addition, the common terminal Port1 is connected to the antennal element 2 in the outer side of the quadplexer 1. That is, the common terminal Port1 also defines and functions as an antenna terminal of the quadplexer 1.

The individual terminals Port11, Port12, Port21, and Port22 are provided in this order for the four filters 11, 12, 21, and 22, respectively, and are connected to the corresponding filters in the inner side of the quadplexer 1. In addition, the individual terminals Port11, Port12, Port21, and Port22 are connected to an RF signal processing circuit (for example, a Radio Frequency Integrated Circuit (RFIC), not illustrated) with an amplification circuit, for example, (not illustrated) interposed therebetween in the outer side of the quadplexer 1.

The filter 11 is disposed on a path that connects the common terminal Port1 and the individual terminal Port11 to each other. In the present preferred embodiment, the filter 11 defines and functions as a reception filter having a pass band that is preferably, for example, a downlink frequency band (reception band) in Band 3 of Long Term Evolution (LTE).

The filter 12 is disposed on a path that connects the common terminal Port1 and the individual terminal Port12 to each other. In the present preferred embodiment, the filter 12 defines and functions as a transmission filter having a pass band that is preferably, for example, an uplink frequency band (transmission band) in Band 3 of LTE. In the present preferred embodiment, the filter 12 corresponds to a first filter disposed on a first path that connects the common terminal Port1 and a first terminal (here, the individual terminal Port12) to each other.

The filter 21 is disposed on a path that connects the common terminal Port1 and the individual terminal Port21 to each other. In the present preferred embodiment, the filter 21 defines and functions as a reception filter having a pass band that is, preferably, for example, a downlink frequency band (reception band) in Band 1 of LTE.

The filter 22 is disposed on a path that connects the common terminal Port1 and the individual terminal Port22 to each other. In the present preferred embodiment, the filter 22 defines and functions as a transmission filter having a pass band that is preferably, for example, an uplink frequency band (transmission band) in Band 1 of LTE. In the present preferred embodiment, the filter 22 corresponds to a second filter disposed on a second path that connects the common terminal Port1 and a second terminal (here, the individual terminal Port22) to each other.

The filter 11 and the filter 12 define an unbalanced duplexer 10 (first duplexer) having a pass band that is preferably Band 3 of LTE, for example. The filter 21 and the filter 22 define an unbalanced duplexer 20 (second duplexer) having a pass band that is preferably Band 1 of LTE, for example. That is, the quadplexer 1 according to the present preferred embodiment is configured such that the common terminal Port1 defines and functions as a common terminal (antenna terminal) of the duplexer 10 having a pass band that is Band 3 of LTE and a common terminal (antenna terminal) of the duplexer 20 having a pass band that is Band 1 of LTE. In the present preferred embodiment, a signal path passing through the duplexer 10 and a signal path passing through the duplexer 20 are connected to each other at a node N. That is, the node N is a point at which these two signal paths join together.

Now, a description will be provided of the frequency bands assigned to Band 1 and Band 3 of LTE, which are pass bands of the quadplexer 1 according to the present preferred embodiment. Hereinafter, a range of a frequency band "A or more to B or less" will be simply referred to as "A-B".

Figure 2:
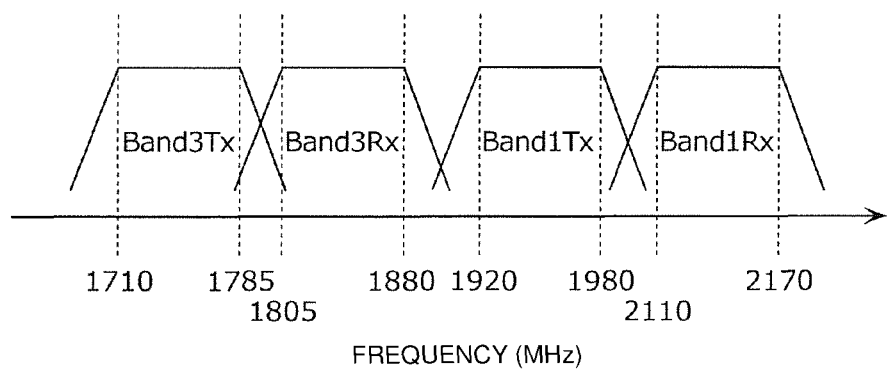
FIG. 2 is a diagram for describing frequency bands assigned to Band 1 and Band 3.

FIG. 2 is a diagram for describing the frequency bands assigned to Band 1 and Band 3. Hereinafter, "Band of LTE" will be simply referred to as "Band", and the reception band (Rx) and the transmission band (Tx) of each Band will be simply written by using the name of Band followed by a symbol representing the reception band or the transmission band. For example, the reception band (Rx) of Band 1 will be referred to as "Band 1 Rx".

As illustrated in FIG. 2, in Band 1, about 1920-1980 MHz is assigned to the transmission band and about 2110-2170 MHz is assigned to the reception band. In Band 3, about 1710-1785 MHz is assigned to the transmission band and about 1805-1880 MHz is assigned to the reception band. Thus, the filters 11, 12, 21, and are required to have filter characteristics to pass the transmission band or the reception band of the corresponding Band and attenuate the other band, as indicated by solid lines in FIG. 2.

As described above, the quadplexer 1 includes the filter (first filter) on the low-frequency side and the filter 22 (second filter) on the high-frequency side. The filter 22 has a pass band frequency that is higher than a pass band frequency of the filter 12. The quadplexer 1 includes the duplexer 10 (first duplexer) including two filters including the filter 12 (in the present preferred embodiment, the filters 11 and 12) and the duplexer 20 (second duplexer) including two filters including the filter 22 (in the present preferred embodiment, the filters 21 and 22).

The pass bands of the two duplexers 10 and 20 are not limited to the combination of Band 3 and Band 1. For example, a combination of Band 25 and Band 66 or a combination of Band 3 and Band 7 may be used. In the quadplexer 1, an impedance element that provides impedance matching, such as an inductor, may be connected on a path that connects the individual filters 11, 12, 21, and 22 and the node N to each other or a path that connects the node N and the common terminal Port1 to each other.

Next, a description will be provided of the basic configurations of the individual filters 11, 12, 21, and 22. Here, the basic configuration of the filter 12 (first filter) having a pass band that is Band 3 Tx will be described as an example.

Figure 3:
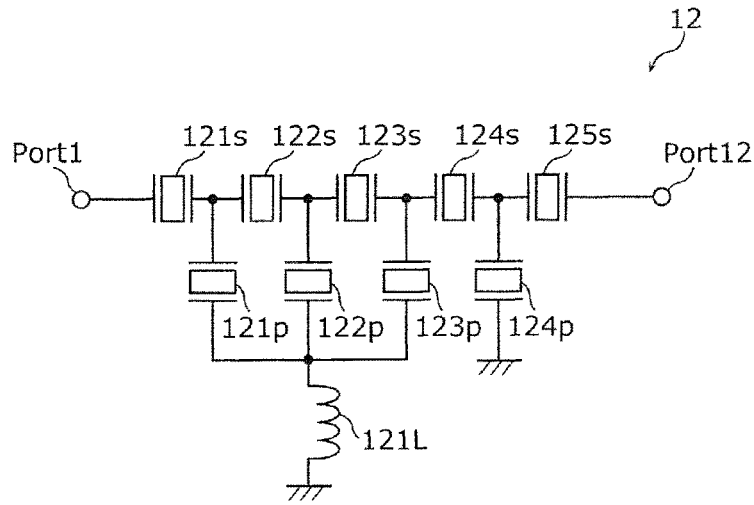
FIG. 3 is a circuit configuration diagram of a filter according to the first preferred embodiment of the present invention.

FIG. 3 is a circuit configuration diagram of the filter 12. As illustrated in FIG. 3, the filter 12 includes series resonators 121s to 125s, parallel resonators 121p to 124p, and an inductor 121L.

The series resonators 121s to 125s are connected in series to one another, in this order from the common terminal Port1 side, on the first path (series arm) that connects the common terminal Port1 and the individual terminal Port12 to each other. The parallel resonators 121p to 124p are connected in parallel to one another on a path (parallel arm) that connects individual connection points of the series resonators 121s to 125s and a reference terminal (ground) to each other. Specifically, the parallel resonators 121p to 123p are connected to the reference terminal with the inductor 121L interposed therebetween, and the parallel resonator 124p is directly connected to the reference terminal. With this connection configuration of the series resonators 121s to 125s and the parallel resonators 121p to 124p, the filter 12 defines and functions as a ladder band pass filter.

As described above, the filter 12 (first filter) has a ladder filter structure including two or more series resonators (in the present preferred embodiment, for example, five series resonators 121s to 125s) disposed on the first path and one or more parallel resonators (in the present preferred embodiment, for example, the four parallel resonators 121p to 124p) disposed on the path(s) that connect the first path and the reference terminal (ground) to each other.

The number of series resonators and the number of parallel resonators of the filter 12 are not limited to five and four, respectively. The number of series resonators may be at least two and the number of parallel resonators may be at least one.

The parallel resonators 121p to 123p may be directly connected to the reference terminal without the inductor 121L interposed therebetween, and the parallel resonator 124p may be connected to the reference terminal with an inductor interposed therebetween. Impedance elements, such as an inductor and a capacitor, may be inserted or connected to the series arm or the parallel arm.

In FIG. 3, the parallel resonators 121p to 123p are connected to a common reference terminal (ground) and the parallel resonator 124p is connected to an individual reference terminal. The common reference terminal and the individual reference terminal are not limited thereto, and may be appropriately selected according to restrictions in the mounting layout of the filter 12, for example.

In addition, a parallel resonator may be connected to a node of the series resonator 121s nearest to the common terminal Port1, the node being between the series resonator 121s and the common terminal Port1, or to a node of the series resonator 125s nearest to the individual terminal Port12, the node being between the series resonator 125s and the individual terminal Port12, among the series resonators 121s to 125s included in a ladder filter structure.

Next, a description will be provided of the basic structures of the individual resonators (series resonators and parallel resonators) of the filter 12 (first filter). In the present preferred embodiment, each resonator is preferably a surface acoustic wave (SAW) resonator, for example.

The configurations of the other filters 11, 21, and 22 are not limited to the above-described configuration and may be appropriately designed in accordance with required filter characteristics and other factors. Specifically, the filters 11, 21, and 22 need not necessarily have a ladder filter structure and may have, for example, a longitudinally coupled filter structure. In addition, the individual resonators included in the filters 11, 21, and 22 are not limited to SAW resonators and may be, for example, bulk acoustic wave (BAW) resonators. Furthermore, the filters 11, 21, and 22 may not include resonators and may instead be, for example, LC resonance filters or dielectric filters.

Figure 4:
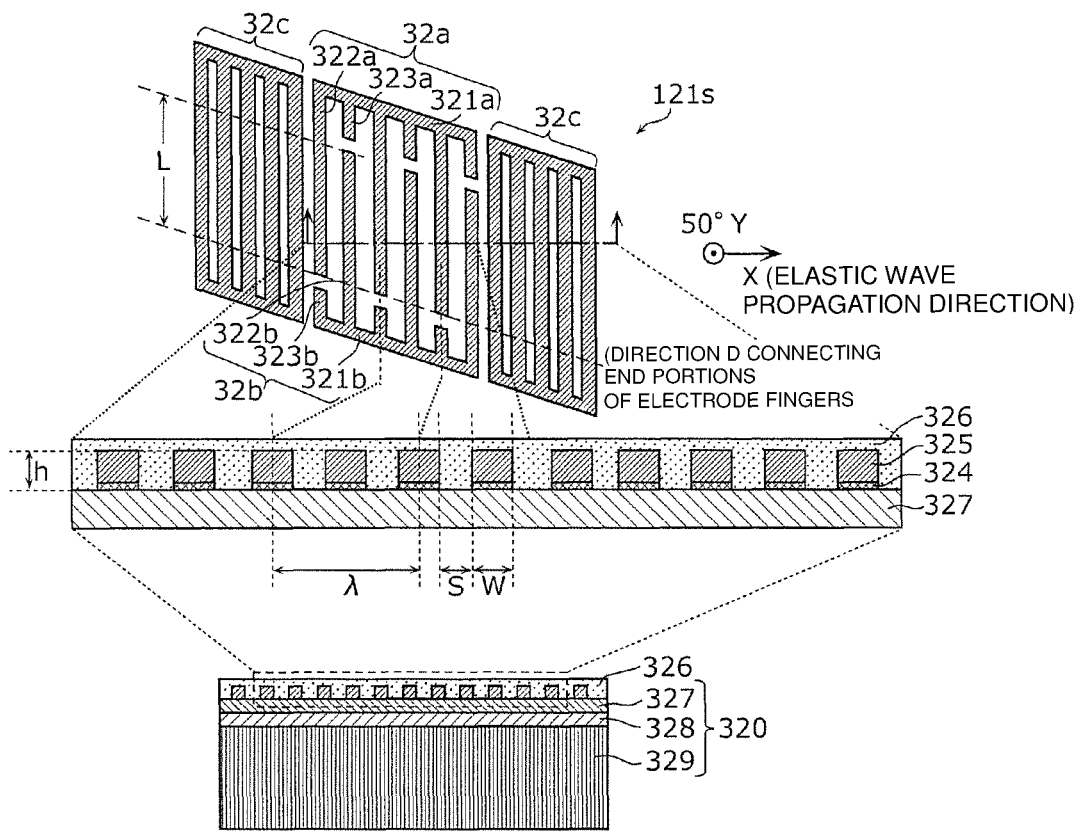
FIG. 4 includes a plan view and a cross-sectional view schematically illustrating a resonator of the filter according to the first preferred embodiment of the present invention.

FIG. 4 includes a plan view and a cross-sectional view schematically illustrating a resonator included in the filter 12 on the low-frequency side according to the present preferred embodiment. FIG. 4 includes a schematic plan view and a schematic cross-sectional view illustrating the structure of the series resonator 121s among the plurality of resonators included in the filter 12. The series resonator 121s illustrated in FIG. 4 is for describing a typical structure of the above-described plurality of resonators, and the number and lengths of electrode fingers defining an electrode are not limited to those illustrated in FIG. 4.

As illustrated in the plan view in FIG. 4, the series resonator 121s includes a pair of comb-teeth electrodes 32a and 32b that face each other and reflectors 32c that are disposed in an elastic wave propagation direction with respect to the pair of comb-teeth electrodes 32a and 32b. The pair of comb-teeth electrodes 32a and 32b define an interdigital transducer (IDT) electrode. One of the pair of reflectors 32c need not necessarily be disposed according to restrictions in the packaging layout.

The comb-teeth electrode 32a has a comb teeth shape and includes a plurality of electrode fingers 322a and a plurality of offset electrode fingers 323a that are parallel or substantially parallel to each other, and a busbar electrode 321a that connects one end of each of the plurality of electrode fingers 322a and one end of each of the plurality of offset electrode fingers 323a to one another. The comb-teeth electrode 32b has a comb teeth shape and includes a plurality of electrode fingers 322b and a plurality of offset electrode fingers 323b that are parallel or substantially parallel to each other, and a busbar electrode 321b that connects one end of each of the plurality of electrode fingers 322b and one end of each of the plurality of offset electrode fingers 323b to one another. The plurality of electrode fingers 322a and 322b and the plurality of offset electrode fingers 323a and 323b extend in a direction orthogonal or substantially orthogonal to the elastic wave propagation direction (X-axis direction). The electrode fingers 322a and the offset electrode fingers 323b face each other in the orthogonal or substantially orthogonal direction, and the electrode fingers 322b and the offset electrode fingers 323a face each other in the orthogonal or substantially orthogonal direction.

Here, a direction D that connects the other ends of the plurality of electrode fingers 322a (the end portions not connected to the busbar electrode 321a of the plurality of electrode fingers 322a) to one another crosses the elastic wave propagation direction (X-axis direction) at a predetermined angle. Also, a direction D that connects the other ends of the plurality of electrode fingers 322b (the end portions not connected to the busbar electrode 321b of the plurality of electrode fingers 322b) to one another crosses the elastic wave propagation direction (X-axis direction) at the predetermined angle. With this structure, the individual IDT electrodes included in the series resonators 121s to 125s and the parallel resonators 121p to 124p are preferably slanted IDTs in which the elastic wave propagation direction crosses a direction in which the plurality of electrode fingers are disposed.

In a one-port resonator that includes a piezoelectric layer and that uses surface acoustic waves, a transverse-mode ripple is generated between a resonant frequency and an anti-resonant frequency, which may degrade the transmission characteristic in the pass band. As measures against this, the filter 12 according to the present preferred embodiment includes a slanted IDT as the IDT electrode of each resonator.

The pair of reflectors 32c are disposed in the direction D with respect to the pair of comb-teeth electrodes 32a and 32b. Specifically, the pair of reflectors 32c are disposed so as to sandwich the pair of comb-teeth electrodes 32a and 32b in the direction D. Each reflector 32c includes a plurality of reflection electrode fingers that are parallel or substantially parallel to each other and reflector busbar electrodes that connect the plurality of reflection electrode fingers to one another. In the pair of reflectors 32c, the reflector busbar electrodes are disposed along the foregoing direction D.

The pair of reflectors 32c having the above-described structure are capable of confining standing waves of propagating elastic waves in the resonator (here, the series resonator 121s) without leaking the waves to the outside. Accordingly, the resonator is capable of allowing an RF signal in the pass band, which is determined by the electrode pitch, the number of pairs, the intersecting width, and other factors of the pair of comb-teeth electrodes 32a and 32b, to propagate therethrough with low loss, and is capable of highly attenuating an RF signal outside the pass band.

The IDT electrode defined by the plurality of electrode fingers 322a and 322b, the plurality of offset electrode fingers 323a and 323b, and the busbar electrodes 321a and 321b preferably has a multilayer structure including an adhesion layer 324 and a main electrode layer 325, for example, as illustrated in the cross-sectional view in FIG. 4. The cross-sectional structure of the reflectors 32c is the same as or substantially the same as that of the IDT electrode, and thus the description thereof is not provided below.

The adhesion layer 324 increases adhesion between a piezoelectric layer 327 and the main electrode layer 325 and is preferably made of Ti, for example. The adhesion layer 324 preferably has a film thickness of, for example, about 12 nm.

The main electrode layer 325 is preferably made of, for example, Al including about 1% Cu. The main electrode layer 325 preferably has a film thickness of, for example, about 162 nm.

A protective layer 326 covers the IDT electrode. The protective layer 326 protects the main electrode layer 325 from an external environment, adjusts frequency-temperature characteristics, and enhances moisture resistance, and is preferably, for example, a film including silicon dioxide as a main component. The protective layer 326 preferably has a film thickness of, for example, about 25 nm.

The materials of the adhesion layer 324, the main electrode layer 325, and the protective layer 326 are not limited to the materials described above. The IDT electrode need not necessarily have the multilayer structure. The IDT electrode may be made of metal, for example, such as Ti, Al, Cu, Pt, Au, Ag, or Pd, or an alloy, or may include a plurality of multilayer bodies made of the foregoing metal or alloy. The protective layer 326 need not necessarily be provided.

The IDT electrode and the reflectors 32c are disposed on a main surface of a substrate 320, which will be described below. Hereinafter, the multilayer structure of the substrate 320 will be described.

As illustrated in the lower portion of FIG. 4, the substrate 320 includes a high-acoustic-velocity supporting substrate 329, a low-acoustic-velocity film 328, and the piezoelectric layer 327, and the high-acoustic-velocity supporting substrate 329, the low-acoustic-velocity film 328, and the piezoelectric layer 327 are laminated in this order.

The piezoelectric layer 327 is a piezoelectric film including a main surface on which the IDT electrode and the reflectors 32c are disposed. The piezoelectric layer 327 is preferably made of, for example, a 50° Y-cut X-propagation LiTaO$_3$ piezoelectric single crystal or piezoelectric ceramics (a lithium tantalate single crystal cut along a plane including a normal that is the Y axis rotated by about 50° around the X axis as the central axis or ceramics through which a surface acoustic wave propagates in the X-axis direction). The thickness of the piezoelectric layer 327 is preferably, for example, about 3.5λ or less when the wavelength of an elastic wave determined by the electrode pitch of the IDT electrode is represented by λ, and is preferably, for example, about 600 nm.

The high-acoustic-velocity supporting substrate 329 is a substrate that supports the low-acoustic-velocity film 328, the piezoelectric layer 327, and the IDT electrode. The high-acoustic-velocity supporting substrate 329 is a substrate through which a bulk wave propagates at an acoustic velocity higher than an acoustic velocity of an elastic wave, such as a surface acoustic wave or a boundary wave, that propagates through the piezoelectric layer 327, and confines a surface acoustic wave within a portion where the piezoelectric layer 327 and the low-acoustic-velocity film 328 are laminated one on top of another and prevents the surface acoustic wave from leaking below the high-acoustic-velocity supporting substrate 329. The high-acoustic-velocity supporting substrate 329 is preferably a silicon substrate, for example, and has a thickness of, for example, about 125 μm. The high-acoustic-velocity supporting substrate 329 may be made of, for example, any one of (1) aluminum nitride, silicon carbide, silicon nitride, silicon, sapphire, or a piezoelectric body such as lithium tantalate, lithium niobate, or crystal; (2) various types of ceramic such as alumina(aluminum oxide), zirconia, cordierite, mullite, steatite, or forsterite; (3) magnesia diamond; (4) material containing any one of the foregoing materials as a main component; and (5) material including a mixture of the above-described materials as a main component.

The low-acoustic-velocity film 328 is a film through which a bulk wave propagates at an acoustic velocity lower than an acoustic velocity of an elastic wave that propagates through the piezoelectric layer 327, and is disposed between the piezoelectric layer 327 and the high-acoustic-velocity supporting substrate 329. With this structure and a property that energy essentially concentrates in a medium through which an elastic wave propagates at a low acoustic velocity, leakage of a surface acoustic wave energy to the outside of the IDT electrode is reduced or prevented. The low-acoustic-velocity film 328 is preferably a film including silicon dioxide as a main component, for example. The thickness of low-acoustic-velocity film 328 is preferably about 2λ or less when the wavelength of an elastic wave determined by the electrode pitch of the IDT electrode is represented by λ, and is preferably, for example, about 670 nm.

According to the above-described multilayer structure of the substrate 320, a Q value at a resonant frequency and an anti-resonant frequency is able to be significantly increased compared to a structure according to the related art in which a piezoelectric substrate is used as a single layer. That is, a SAW resonator with a large Q value is able to be provided and, thus, a filter with low insertion loss is able to be provided by the SAW resonator.

The high-acoustic-velocity supporting substrate 329 may have a multilayer structure including a supporting substrate and a high-acoustic-velocity film through which a bulk wave propagates at an acoustic velocity higher than an acoustic velocity of an elastic wave, such as a surface acoustic wave or boundary wave, that propagates through the piezoelectric layer 327. In this case, the supporting substrate may preferably be made of, for example, sapphire or a piezoelectric body such as lithium tantalate, lithium niobate, or crystal; various types of ceramic such as alumina, magnesia, silicon nitride, aluminum nitride, silicon carbide, zirconia, cordierite, mullite, steatite, or forsterite; a dielectric body such as glass; semiconductor such as silicon or gallium nitride; a resin substrate; or other suitable materials. The high-acoustic-velocity film may be made of various high-acoustic-velocity materials such as aluminum nitride, aluminum oxide, silicon carbide, silicon nitride, silicon oxynitride, DLC film or diamond, a medium containing any of the foregoing materials as a main component, or a medium including a mixture of the above-described materials as a main component.

In the present preferred embodiment, the IDT electrode defining the filter 12 is provided on the substrate 320 including the piezoelectric layer 327. Alternatively, the substrate on which the IDT electrode is provided may be a piezoelectric substrate defined by the piezoelectric layer 327 as a single layer. In this case, the piezoelectric substrate is preferably made of, for example, a piezoelectric single crystal of $LiTaO_3$ or another piezoelectric single crystal of $LiNbO_3$ or other suitable material.

The substrate on which the IDT electrode defining the filter 12 is provided may have either a single layer structure including a single piezoelectric layer or a multilayer structure in which a piezoelectric layer is laminated on a supporting substrate, as long as the substrate includes a piezoelectric layer.

The piezoelectric layer 327 according to the present preferred embodiment preferably uses a 50° Y-cut X-propagation $LiTaO_3$ single crystal, but the cut-angle of the single crystal material is not limited thereto. That is, the multilayer structure, material, and the thickness may be appropriately changed in accordance with a required bandpass characteristic of an elastic wave filter device. A similar effect is able to be obtained also in a SAW filter that uses a $LiTaO_3$ piezoelectric substrate or $LiNbO_3$ piezoelectric substrate having a cut-angle other than the above-described cut-angle.

Now, the electrode parameters of IDT electrodes included in SAW resonators will be described.

The wavelength of the SAW resonator is defined as a wavelength λ, which is a repetition period of the plurality of electrode fingers 322a or 322b constituting the IDT electrode illustrated in the middle portion of FIG. 4. The electrode pitch is half the wavelength λ and is defined as (W+S), where W represents a line width of each of the electrode fingers 322a and 322b defining the comb-teeth electrodes 32a and 32b, respectively, and S represents a space width between the electrode fingers 322a and 322b adjacent to each other. An intersecting width L of the pair of comb-teeth electrodes 32a and 32b is a length over which the electrode fingers 322a and 322b intersect each other viewed in the direction D, as illustrated in the upper part of FIG. 4. The electrode duty ratio of each resonator is an occupancy of the line widths of the plurality of electrode fingers 322a and 322b, that is, a ratio of the line widths of the plurality of electrode fingers 322a and 322b to the sum of the line widths and the space widths, and is defined as W/(W+S).

Table 1 shows the details of the electrode parameters (wavelength λ, intersecting width L, number of pairs M, and electrode duty ratio R) of the series resonators 121s to 125s and the parallel resonators 121p to 124p included in the filter 12 according to an Example of a preferred embodiment of the present invention and a Comparative Example.

TABLE 1

|  | Series resonator 121s | Series resonator 122s | Series resonator 123s | Series resonator 124s | Series resonator 125s |
| --- | --- | --- | --- | --- | --- |
| Wavelength λ (μm) | 2.1445 | 2.1694 | 2.1646 | 2.1678 | 2.1420 |
| Intersecting width L (μm) | 18.7 | 20.1 | 18.0 | 33.0 | 17.6 |
| Number of pairs M | 140 | 190 | 128 | 107 | 150 |
| Electrode duty ratio R | 0.5 | 0.5 | 0.5 | 0.5 | 0.5 |

|  | Parallel resonator 121p | Parallel resonator 122p | Parallel resonator 123p | Parallel resonator 124p |
| --- | --- | --- | --- | --- |
| Wavelength λ (μm) | 2.2508 | 2.2507 | 2.2398 | 2.2506 |
| Intersecting width L (μm) | 80.0 | 82.0 | 32.8 | 48.8 |
| Number of pairs M | 60 | 38 | 108 | 113 |
| Electrode duty ratio R | 0.5 | 0.5 | 0.5 | 0.5 |

In the Example and the Comparative Example, the series resonators and the parallel resonators are each defined by a slanted IDT. Alternatively, only the series resonators may each be defined by a slanted IDT.

In the Example and the Comparative Example, the series resonators and parallel resonators each include offset electrode fingers. Alternatively, each resonator need not necessarily include offset electrode fingers.

The electrode parameters of the individual resonators shown in Table 1 are the same or substantially the same in both of the Example and the Comparative Example and are common in the individual series resonators 121s to 125s and parallel resonators 121p to 124p. In contrast, a description will be provided below of a case in which, in the filter 12 according to the Example, the resonator structure varies between the series resonator 121s and the other series resonators 122s to 125s.

Figure 5A:
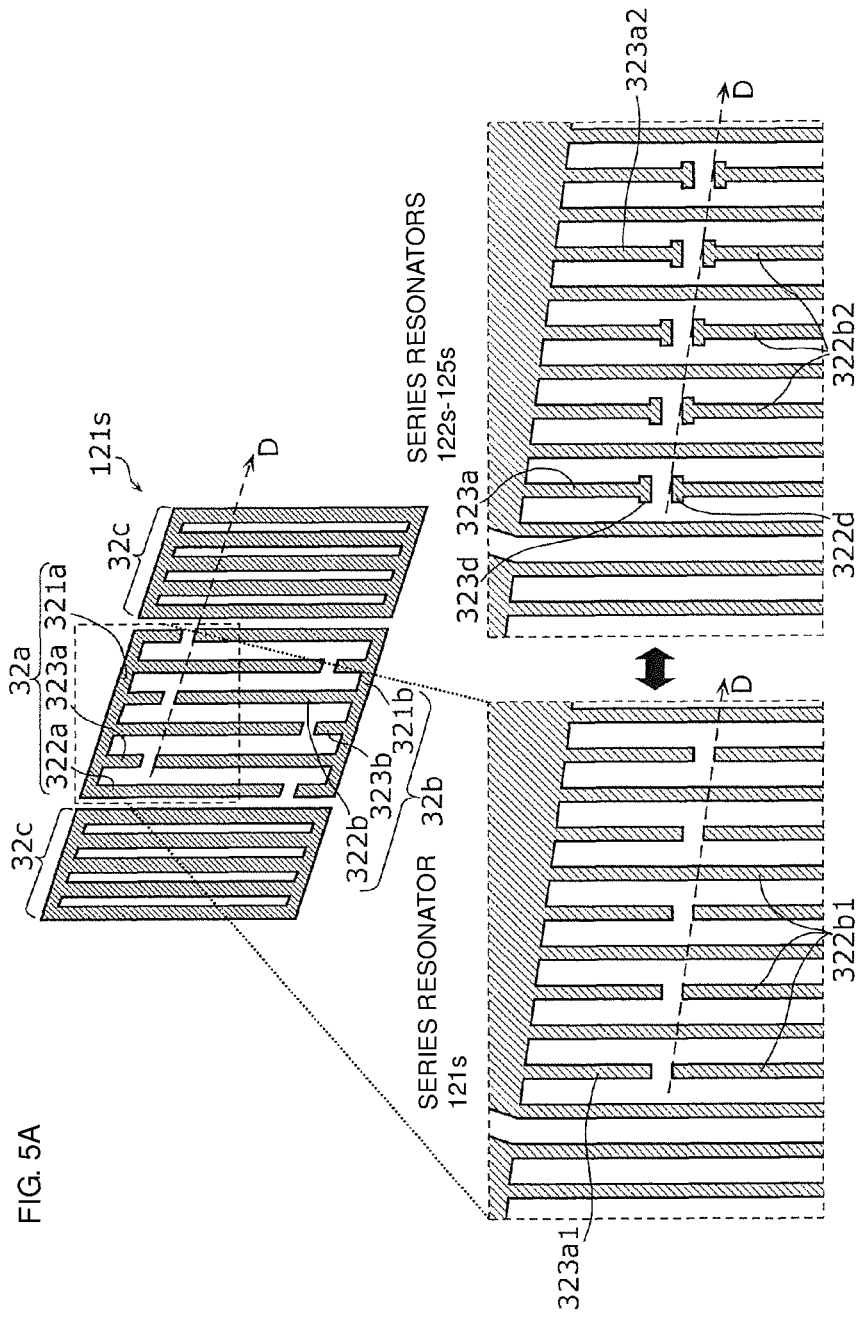
FIG. 5A is a plan view of an IDT electrode of a filter on a low-frequency side according to an Example of a preferred embodiment of the present invention.

FIG. 5A is a plan view of the IDT electrode of the filter 12 on the low-frequency side according to the Example. FIG. 5B is a plan view of the IDT electrode of a filter on the low-frequency side according to the Comparative Example.

As illustrated in FIG. 5A, in the filter 12 on the low-frequency side according to the Example, in the series resonator 121s nearest to the common terminal Port1 among the series resonators 121s to 125s, the electrode fingers 322a and 322b (322b1 in FIG. 5A) and the offset electrode fingers 323a (323a1 in FIG. 5A) and 323b defining the pair of comb-teeth electrodes 32a and 32b are not variant fingers. A variant finger is, among a plurality of electrode fingers, an electrode finger having a width that is larger at the end portion not connected to the busbar electrode than at the central portion of the electrode finger. That is, the plurality of electrode fingers 322a and 322b defining the series resonator 121s are second electrode fingers each having a width that is smaller at the end portion than at the central portion or that is the same or substantially the same at both of the end portion and the central portion.

On the other hand, in the other series resonators 122s to 125s, the electrode fingers 322a and 322b (322b2 including an end portion 322d in FIG. 5A) and the offset electrode fingers 323a (323a2 including an end portion 323d in FIG. 5A) and 323b defining the pair of comb-teeth electrodes 32a and 32b are variant fingers. That is, the plurality of electrode fingers 322a and 322b defining the series resonators 122s to 125s are first electrode fingers each having a width that is larger at the end portion than at the central portion.

In contrast, in the filter 12 on the low-frequency side according to the Comparative Example, in all of the series resonators 121s to 125s, the electrode fingers 322a and 322b (322b2 including an end portion 322d in FIG. 5B) and the offset electrode fingers 323a (323a2 including an end portion 323d in FIG. 5B) and 323b defining the pair of comb-teeth electrodes 32a and 32b are variant fingers. That is, the plurality of electrode fingers 322a and 322b defining the series resonators 121s and 125s are first electrode fingers (variant fingers) each having a width that is larger at the end portion than at the central portion.

That is, in the filter 12 on the low-frequency side according to the Example, the series resonator 121s nearest to the common terminal Port1 is defined by the second electrode fingers, whereas the other series resonators 122s to 125s are defined by the first electrode fingers (variant fingers). In contrast, in the filter on the low-frequency side according to the Comparative Example, all of the series resonators are constituted by the first electrode fingers (variant fingers).

Hereinafter, a description will be provided of an advantageous effect obtained in the quadplexer 1 according to the Example having the above-described configuration in comparison with the quadplexer according to the Comparative Example.

Figure 6A:
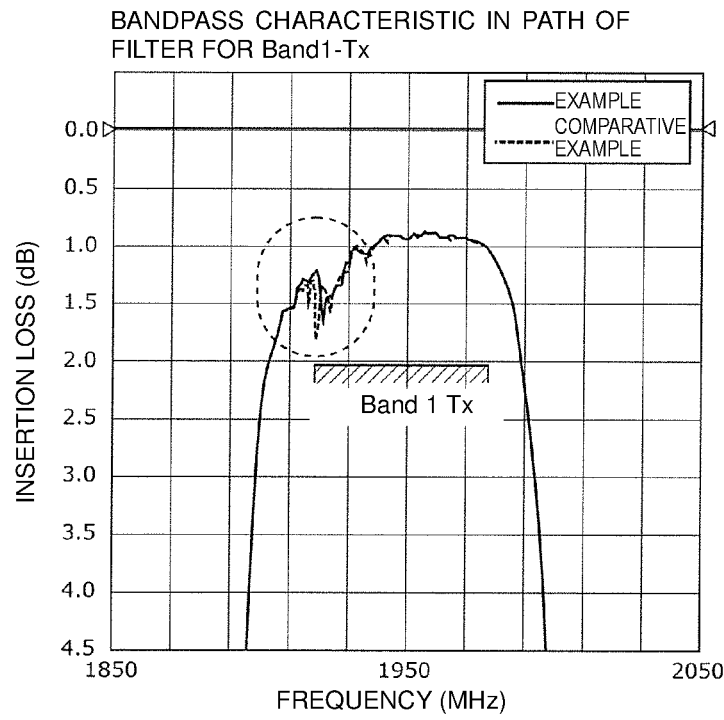
FIG. 6A is a graph illustrating a bandpass characteristic of a filter on a high-frequency side according to the Example in comparison with the Comparative Example.

FIG. 6A is a graph illustrating the bandpass characteristics of the filter 22 on the high-frequency side according to the Example in comparison with the Comparative Example. Specifically, FIG. 6A illustrates the bandpass characteristics of the path running through the filter 22 on the high-frequency side (the filter for Band 1 Tx), and more specifically illustrates insertion loss, which is a ratio of the intensity of a signal output from the common terminal Port1 to the intensity of a signal input to the individual terminal Port22. As is clear from FIG. 6A, in the Example, the ripple in the pass band (here, in Band 1 Tx) is reduced compared to the Comparative Example (the broken-line encircled portion of FIG. 6A).

Figure 6B:
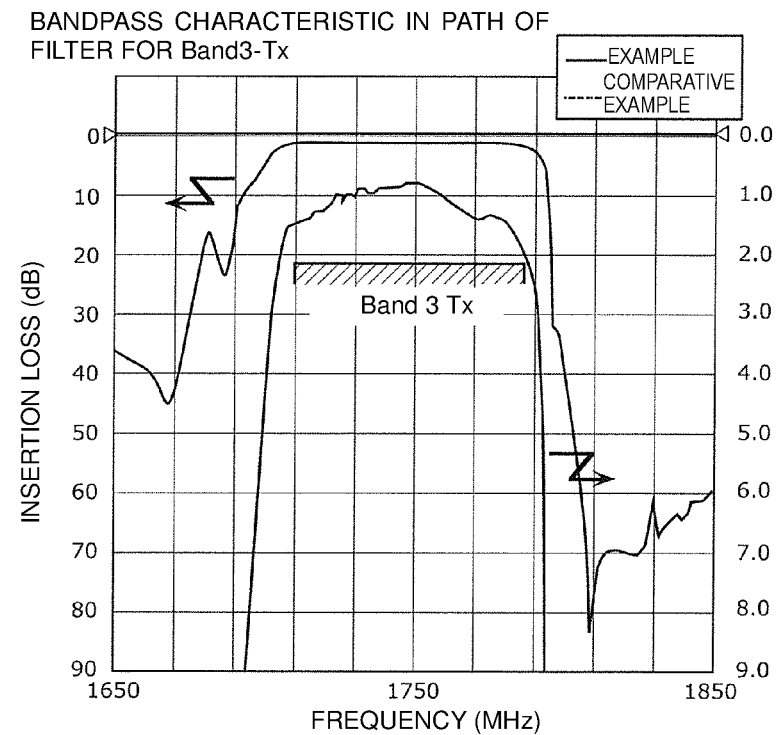
FIG. 6B is a graph illustrating a bandpass characteristic of the filter on the low-frequency side according to the Example in comparison with the Comparative Example.

FIG. 6B is a graph illustrating the bandpass characteristics of the filter 12 on the low-frequency side (the filter for Band 3 Tx) according to the Example in comparison with the Comparative Example. Specifically, FIG. 6B illustrates the bandpass characteristics of the path running through the filter 12 on the low-frequency side (the filter for Band 3 Tx), and more specifically illustrates insertion loss, which is a ratio of the intensity of a signal output from the common terminal Port1 to the intensity of a signal input to the individual terminal Port12. As illustrated in FIG. 6B, the insertion loss in the pass band of the filter 12 is the same or substantially the same in the Example and the Comparative Example, and no difference is seen.

That is, in the quadplexer 1 according to the Example, compared to the quadplexer according to the Comparative Example, the ripple in the pass band of the filter 22 on the high-frequency side is reduced, with the low-loss characteristic in the pass band of the filter 12 on the low-frequency side being maintained.

The following are reasons for the above advantageous effects.

Figure 7:
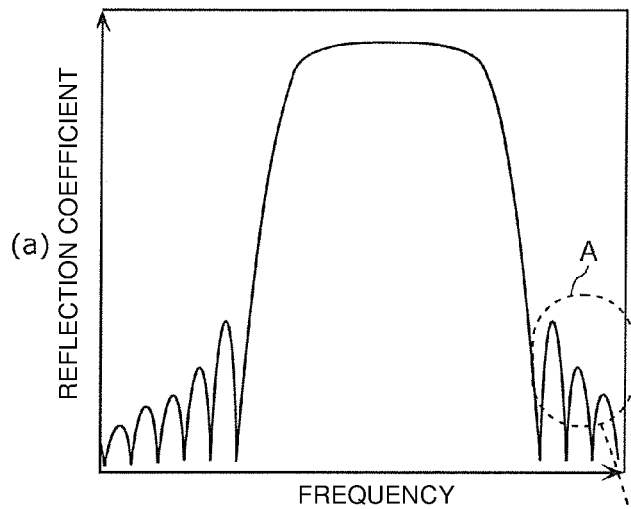
FIG. 7 is a diagram conceptually illustrating a factor of generating a ripple in a pass band of a filter on a high-frequency side in the Comparative Example.
Figure 7:
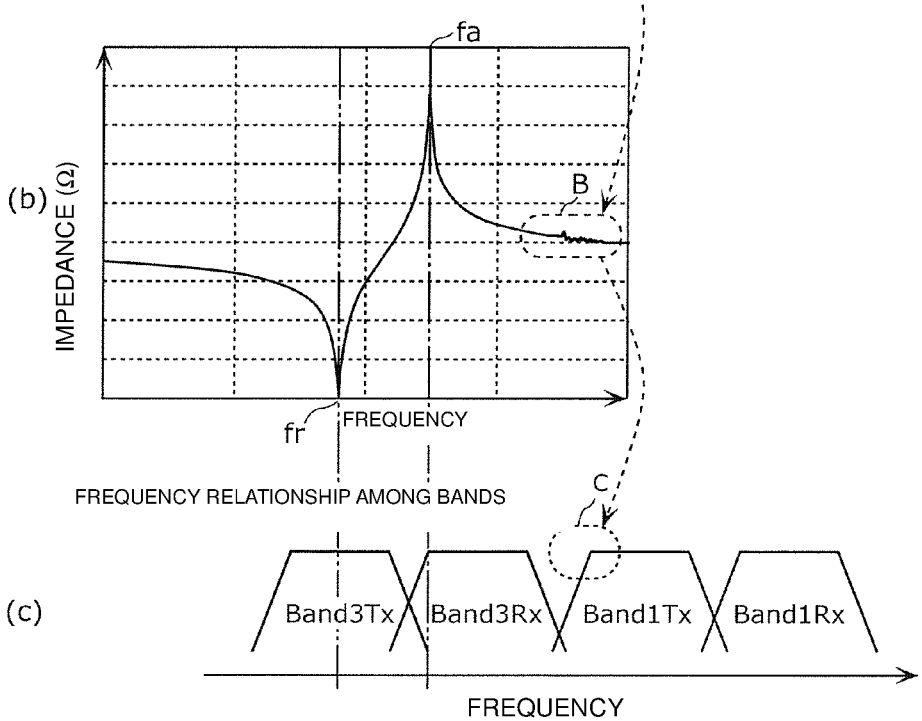

FIG. 7 is a diagram conceptually illustrating a factor of generating a ripple in the pass band of the filter 22 on the high-frequency side in the Comparative Example. Part (a) of FIG. 7 is a graph schematically illustrating the reflection characteristics of each reflector 32c included in a resonator, and specifically illustrates the frequency characteristics of the reflection coefficient. Part (b) of FIG. 7 is a graph schematically illustrating the resonance characteristics of the resonator, and specifically illustrates the frequency characteristics of the impedance (impedance characteristic) of the resonator. Part (c) of FIG. 7 is a diagram for describing the frequency relationship between Band 1 and Band 3, similar to FIG. 2, and schematically illustrates, with solid lines, the filter characteristics required for the individual filters 11, 12, 21, and 22.

The reflector 32c is designed to have a high reflection coefficient in a predetermined band including the resonant frequency of the resonator so that a surface acoustic wave that propagates thereto is confined therein without being leaked to the outside.

In this case, as illustrated in part (a) of FIG. 7, fluctuations in the reflection coefficient, in which the reflection coefficient repeatedly increases and decreases, resulting from the reflector 32c occur in the band around the predetermined band at which the reflection coefficient is high (the portion A in FIG. 7).

In the SAW resonator, as illustrated in part (b) of FIG. 7, the fluctuations in the reflection coefficient cause a ripple in the impedance characteristic (the portion B in FIG. 7) on the high-frequency side of the resonance characteristic (that is, the high-frequency side of both a resonant frequency fr and an anti-resonant frequency fa).

Generally, in a filter having a ladder filter structure, a resonant frequency frs of a series resonator and an anti-resonant frequency fap of a parallel resonator are set to be equal or substantially equal to each other, and accordingly, a band pass filter in which frs and fap define a center frequency of the pass band is provided. Therefore, if a SAW resonator is used as a series resonator in the ladder filter structure, a stop-band ripple (a ripple generated in the stop band) resulting from the reflector 32c is generated in the stop band on the high-frequency side of the band pass filter.

Such a stop-band ripple does not matter so much in a single filter. However, in a multiplexer including a plurality of filters, if a frequency at which a stop-band ripple of one of the filters is generated is within the pass band of another one of the filters, the stop-band ripple causes an increase in a ripple in the pass band of the other filter (pass-band ripple).

In the present preferred embodiment, if the electrode fingers defining the IDT electrode of the series resonator 121s of the filter 12 for Band 3 Tx are the first electrode fingers (variant fingers) such as the electrode fingers defining the IDT electrodes of the other series resonators 122s to 125s as in the Comparative Example, a ripple generated by the series resonator 121s is in Band 1 Tx (see parts (b) and (c) of FIG. 7). Thus, in the Comparative Example, a ripple is generated in the pass band in the path running through the filter 22 on the high-frequency side (the filter for Band 1 Tx), although low loss is maintained in the filter 12 on the low-frequency side (the filter for Band 3 Tx).

In contrast, in the Example, the electrode fingers defining the IDT electrode of the series resonator 121s of the filter 12 for Band 3 Tx are the second electrode fingers (not variant fingers), which are different from the electrode fingers defining the IDT electrodes of the other series resonators 122s to 125s. Accordingly, a ripple in the pass band is able to be reduced or prevented in the path running through the filter 22 (the filter for Band 1 Tx). This will be described below with reference to FIGS. 8A and 8B.

Figure 8A:
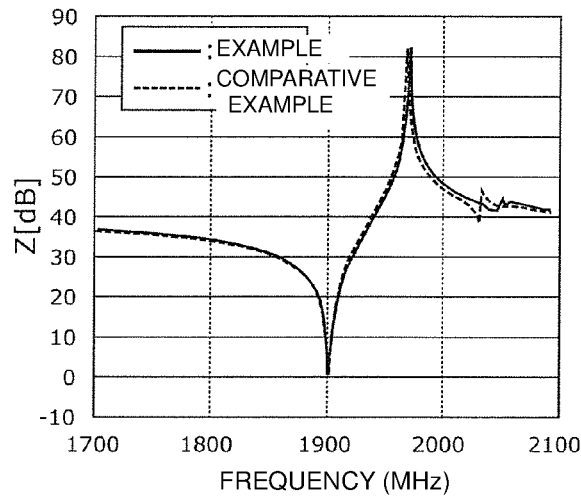
FIG. 8A is a graph illustrating a resonance characteristic of a series resonator of the filter on the low-frequency side according to the Example in comparison with the Comparative Example.
Figure 8B:
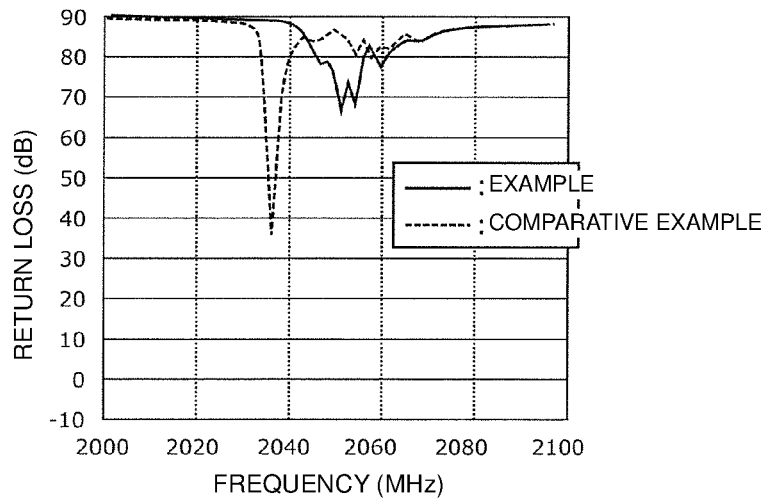
FIG. 8B is a graph illustrating a reflection characteristic of the series resonator of the filter on the low-frequency side according to the Example in comparison with the Comparative Example.

FIG. 8A is a graph illustrating the resonance characteristics of the series resonator 121s of the filter 12 on the low-frequency side according to the Example in comparison with the Comparative Example. FIG. 8B is a graph illustrating the reflection characteristics of the series resonator 121s of the filter 12 on the low-frequency side according to the Example in comparison with the Comparative Example. Specifically, FIG. 8A illustrates the resonance characteristics of the series resonator 121s including the first electrode fingers (variant fingers) according to the Comparative Example (broken line) and the resonance characteristics of the series resonator 121s including the second electrode fingers according to the Example (solid line). FIG. 8B illustrates the reflection characteristics of the series resonator 121s including the first electrode fingers (variant fingers) according to the Comparative Example (broken line) and the reflection characteristics of the series resonator 121s including the second electrode fingers according to the Example (solid line). As the reflection characteristics, return loss is illustrated, which is a ratio of the intensity of a signal output to the common terminal Port1 to the intensity of a signal input to the filter 12 from the common terminal Port1.

If the resonator has the multiplayer structure including the IDT electrode, the piezoelectric layer 327, the low-acoustic-velocity film 328, and the high-acoustic-velocity supporting substrate 329 and the slanted IDT structure, a favorable Q characteristic of the resonator is obtained in the configuration including variant fingers (the Comparative Example), as illustrated in FIG. 8A. However, in the configuration including variant fingers (the Comparative Example), a stop-band ripple increases on the high-frequency side of the anti-resonant frequency, as illustrated in FIG. 8B. In contrast, in the configuration not including variant fingers (the Example), a stop-band ripple is reduced on the high-frequency side of the anti-resonant frequency, compared to the Comparative Example.

In a multiplexer including a plurality of filters (in the present preferred embodiment, the filters 11, 12, 21, and 22), the characteristics of the series resonator nearest to the common terminal Port1 of one filter (in the present preferred embodiment, the characteristics of the series resonator 121s of the filter for Band 3 Tx) have an influence on the characteristics of the other filters (in the present preferred embodiment, the filter for Band 3 Rx, the filter for Band 1 Tx, and the filter for Band 1 Rx).

If the filter 12 (the filter for Band 3 Tx) has the multilayer structure including the IDT electrode, the piezoelectric layer 327, the low-acoustic-velocity film 328, and the high-acoustic-velocity supporting substrate 329 and the slanted IDT structure, a low-loss characteristic in the pass band of the filter 12 is able to be acquired by using variant fingers as the electrode fingers of the IDT electrode so as to increase the Q values of individual resonators.

However, if the frequency at which a stop-band ripple is generated in the filter 12 is included in the frequency band of the filter 22 (the filter for Band 1 Tx), a ripple is generated in the characteristics in the pass band of the filter 22. In contrast, in the Example, the proportion of variant fingers in the series resonator 121s that has the largest influence on the reflection characteristics of the filter 12 is lower than in the other series resonators 122s to 125s, so that the ripple in the pass band of the filter 22 is reduced with the low-loss characteristic in the pass band of the filter 12 being acquired. Accordingly, the stop-band ripple of the filter 12 is able to be reduced. Thus, in the multiplexer in which the filter on the low-frequency side and the filter on the high-frequency side are connected to a common terminal, the ripple in the pass band of the filter 22 on the high-frequency side is able to be reduced or prevented without degrading the filter characteristics of the filter 12 on the low-frequency side.

The multiplexers according to preferred embodiments of the present invention are not limited to the above-described configuration. For example, in the filter 12 according to the Example, the ratio of the number of second electrode fingers to the total number of electrode fingers included in the series resonator 121s nearest to the common terminal Port1 may be higher than the ratio of the number of second electrode fingers to the total number of electrode fingers included in each of the other series resonators 122s to 125s.

Accordingly, the ripple in the pass band of the filter 22 is able to be reduced or prevented without degrading the filter characteristics of the filter 12, compared to a case in which the proportion of variant fingers is the same or substantially the same in all of the series resonators 121s to 125s constituting the filter 12.

Furthermore, in the filter 12 according to the Example, the number of first electrode fingers (variant fingers) in the IDT electrode included in the series resonator 121s nearest to the common terminal Port1 may be smaller than the number of first electrode fingers (variant fingers) in the IDT electrode included in each of the other series resonators 122s to 125s.

Accordingly, the ripple in the pass band of the filter is able to be effectively reduced or prevented even if the electrode parameters, such as the number of pairs and an intersecting width, vary among the individual IDT electrodes of the individual series resonators.

In the first preferred embodiment, a description has been provided of, as an example, the configuration of the first filter (in the first preferred embodiment, the filter 12) having only a ladder filter structure. Alternatively, the first filter may have a longitudinally coupled filter structure in addition to the ladder filter structure. In a Modified Example of a preferred embodiment of the present invention, a description will be provided of a quadplexer including a first filter having such a filter structure. Among a plurality of filters included in the quadplexer, the filters other than the first filter have the same or substantially the same configuration as in the first preferred embodiment, and thus, the description thereof is omitted.

Figure 9:
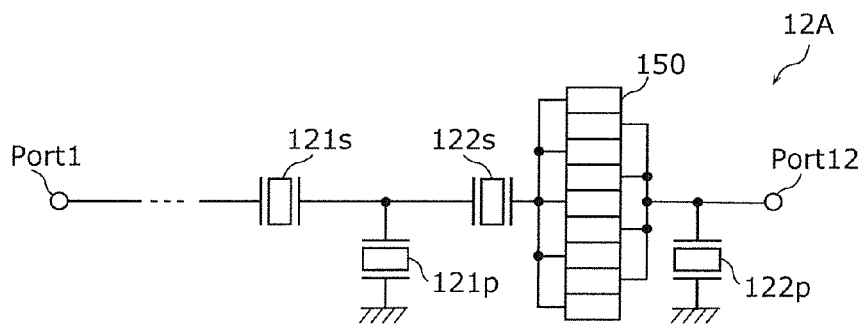
FIG. 9 is a circuit configuration diagram of a filter according to a Modified Example of the first preferred embodiment of the present invention.

FIG. 9 is a circuit configuration diagram of a filter 12A (first filter) according to Modification Example of the first preferred embodiment.

As illustrated in FIG. 9, the filter 12A includes series resonators 121s and 122s, parallel resonators 121p and 122p, and a longitudinally coupled resonator 150. That is, the filter 12A includes the longitudinally coupled resonator 150 added to the ladder filter structure.

The longitudinally coupled resonator 150 has a longitudinally coupled filter structure and is disposed between the common terminal Port1 and the individual terminal Port12. In the present preferred embodiment, the longitudinally coupled resonator 150 is disposed between the series resonator 122s and the individual terminal Port12 and preferably includes, for example, nine IDTs and reflectors disposed on both sides of the nine IDTs. The position of the longitudinally coupled resonator 150 is not limited thereto. For example, the longitudinally coupled resonator 150 may be disposed between the series resonator 121s and the series resonator 122s or between the series resonator 121s and the common terminal Port1.

Also in the quadplexer including the first filter (in the Modified Example, the filter 12A) having the above-described configuration, the ripple in the pass band is able to be reduced or prevented by setting the ratio of the number of second electrode fingers to the total number of electrode fingers included in the series resonator nearest to the common terminal Port1 (in the present preferred embodiment, the series resonator 121s) to be higher than the ratio of the number of second electrode fingers to the total number of electrode fingers included in each of the other series resonators, as in the first preferred embodiment.

In addition, the filter 12A according to the present preferred embodiment, which has a longitudinally coupled filter structure, is adaptable to required filter characteristics, for example, attenuation enhancement.

Second Preferred Embodiment

The quadplexers according to the first preferred embodiment and the Modified Example are applicable to an RF front-end circuit and also to a communication device including the RF front-end circuit. In the present preferred embodiment, a description will be provided of the RF front-end circuit and the communication device.

Figure 10:
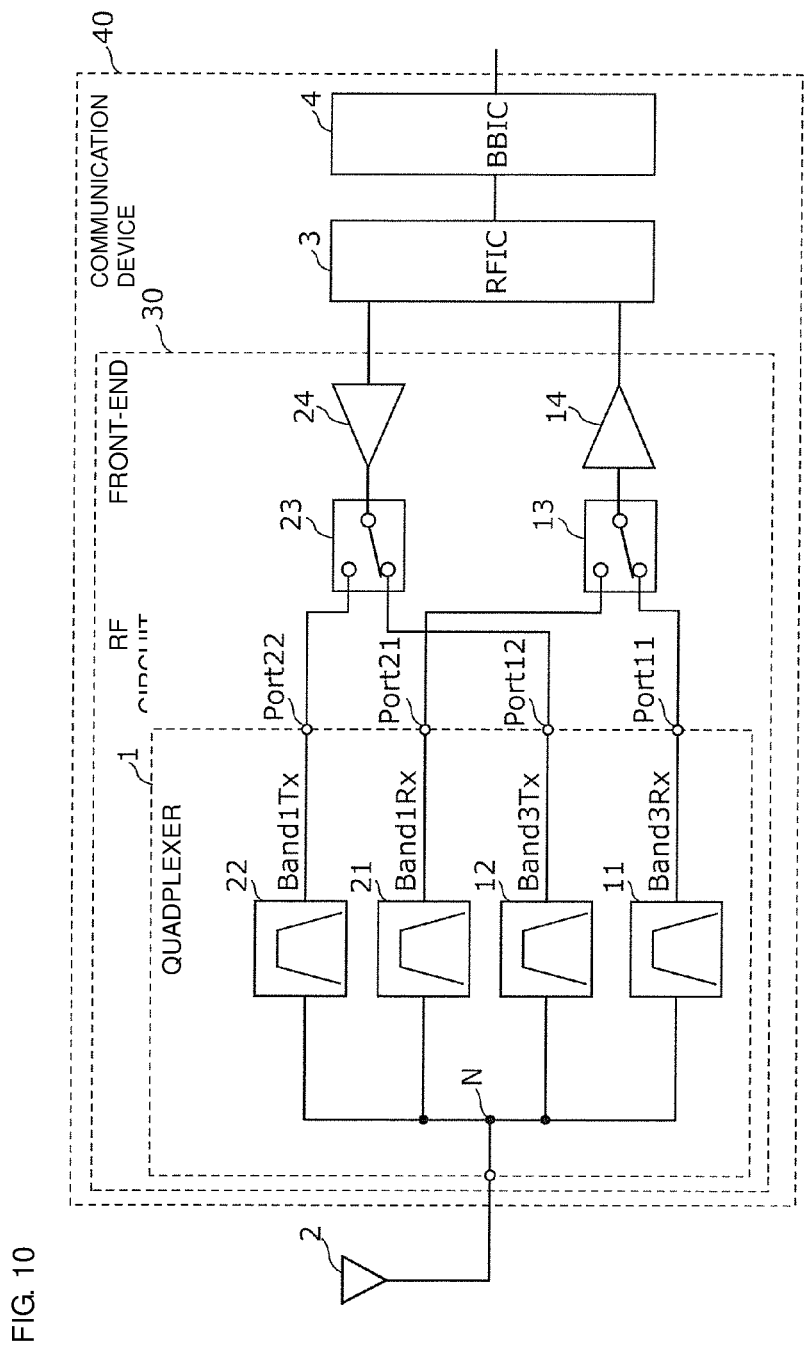
FIG. 10 is a configuration diagram of a radio-frequency front-end circuit according to a second preferred embodiment of the present invention.

FIG. 10 is a configuration diagram of an RF front-end circuit 30 according to the second preferred embodiment. FIG. 10 also illustrates the individual elements connected to the RF front-end circuit 30 (the antenna element 2, an RF signal processing circuit (RFIC) 3, and a baseband signal processing circuit (BBIC) 4). The RF front-end circuit 30, the RF signal processing circuit 3, and the baseband signal processing circuit 4 define a communication device 40.

The RF front-end circuit 30 includes the quadplexer 1 according to the first preferred embodiment, a reception-side switch 13 and a transmission-side switch 23, a low-noise amplification circuit 14, and a power amplification circuit 24.

The reception-side switch 13 is a switch circuit including two selection terminals respectively connected to the individual terminals Port11 and Port21, which are reception terminals of the quadplexer 1, and a common terminal connected to the low-noise amplification circuit 14.

The transmission-side switch 23 is a switch circuit including two selection terminals respectively connected to the individual terminals Port12 and Port22, which are transmission terminals of the quadplexer 1, and a common terminal connected to the power amplification circuit 24.

Each of the reception-side switch 13 and the transmission-side switch 23 connects the common terminal and a signal path corresponding to a predetermined band to each other in accordance with a control signal received from a control unit (not illustrated), and is preferably defined by, for example, a single pole double throw (SPDT) switch. The number of selection terminals connected to the common terminal is not limited one, and a plurality of selection terminals may be connected. That is, the RF front-end circuit 30 may be compatible with carrier aggregation.

The low-noise amplification circuit 14 is a reception amplification circuit that amplifies an RF signal (here, an RF reception signal) received via the antenna element 2, the quadplexer 1, and the reception-side switch 13 and outputs the RF signal to the RF signal processing circuit 3.

The power amplification circuit 24 is a transmission amplification circuit that amplifies an RF signal (here, an RF transmission signal) output from the RF signal processing circuit and outputs the RF signal to the antenna element 2 via the transmission-side switch 23 and the quadplexer 1.

The RF signal processing circuit 3 performs signal processing, such as down converting, for example, on the RF reception signal received from the antenna element 2 through the reception signal path, and outputs a reception signal generated by the signal processing to the baseband signal processing circuit 4. Also, the RF signal processing circuit 3 performs signal processing, such as up converting, for example, on the transmission signal received from the baseband signal processing circuit 4, and outputs an RF transmission signal generated by the signal processing to the power amplification circuit 24. The RF signal processing circuit 3 is preferably, for example, an RFIC.

The signal processed by the baseband signal processing circuit 4 is used as an image signal to display an image or as a voice signal for a phone call, for example.

The RF front-end circuit 30 may include another circuit element that is disposed between the above-described elements.

The RF front-end circuit 30 and the communication device having the above-described configuration are capable of reducing or preventing a ripple in the pass band by including the quadplexer 1 according to the first preferred embodiment.

The RF front-end circuit 30 may include the quadplexer according to the Modified Example of the first preferred embodiment instead of the quadplexer 1 according to the first preferred embodiment.

The communication device 40 need not necessarily include the baseband signal processing circuit (BBIC) 4 depending on the processing scheme for an RF signal.

The multiplexers, the RF front-end circuits, and the communication devices according to preferred embodiments of the present invention have been described above with reference to the first and second preferred embodiments and the Modified Example. Other preferred embodiments implemented by combining any selective elements in the above-described preferred embodiments and the Modified Example, another modified example implemented by applying, to the above-described preferred embodiments, various modifications conceived of by a person skilled in the art without deviating from the gist of the present invention, and various apparatuses including the RF front-end circuit and communication device according to preferred embodiments of the present invention are also included in the present invention.

A description has been provided above of a quadplexer as an example of a multiplexer. However, the present invention is applicable to, for example, a triplexer including three filters connected to a common antenna terminal or a hexaplexer including six filters connected to a common antenna terminal. That is, any multiplexer including two or more filters may be applied.

Furthermore, the configuration of the multiplexer is not limited to a configuration including both a transmission filter and a reception filter. A configuration including only a transmission filter or only a reception filter may be applied.

In the first preferred embodiment, a description has been provided of a case in which the filter 12 corresponds to the first filter and the filter 22 corresponds to the second filter. That is, both of the first and second filters are transmission filters in the first preferred embodiment. However, preferred embodiments of the present invention are applicable to any multiplexer in which the stop-band ripple of the first filter is within the pass band of the second filter, regardless of the uses of the first and second filters. Thus, at least one of the first and second filters may be a reception filter.

Preferred embodiments of the present invention may be widely used, as a multiplexer, a front-end circuit, and a communication device that are applicable to a multiband system, for a communication apparatus, such as a cellular phone.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multiplexer comprising:
   a common terminal, a first terminal, and a second terminal;
   a first filter disposed on a first path that connects the common terminal and the first terminal to each other; and
   a second filter disposed on a second path that connects the common terminal and the second terminal to each other, the second filter having a pass band frequency that is higher than a pass band frequency of the first filter; wherein
   the first filter includes:
   two or more series resonators disposed on the first path; and
   one or more parallel resonators disposed on a path that connects the first path and a ground to each other;
   each of the two or more series resonators and the one or more parallel resonators includes an IDT electrode and a reflector that are provided on a substrate including a piezoelectric layer, the IDT electrode including a pair of comb-teeth electrodes;
   each of the pair of comb-teeth electrodes included in each of the two or more series resonators includes:
   a plurality of electrode fingers extending in a direction orthogonal or substantially orthogonal to an elastic wave propagation direction; and
   a busbar electrode that connects one end of each of the plurality of electrode fingers to one another;
   a direction passing through other ends of the plurality of electrode fingers crosses the elastic wave propagation direction at a predetermined angle;
   the IDT electrode included in each of the two or more series resonators includes at least one of a first electrode finger type including first electrode fingers and a second electrode finger type including second electrode fingers among the plurality of electrode fingers, each of the first electrode fingers having a width that is larger at the other end than at a central portion, each of the second electrode fingers having a width that is smaller at the other end than at a central portion or that is the same or substantially the same at both of the other end and the central portion; and
   a ratio of a number of the second electrode fingers to a number of the plurality of electrode fingers included in a series resonator nearest to the common terminal among the two or more series resonators is higher than a ratio of a number of the second electrode fingers to a number of the plurality of electrode fingers included in each of the other one or more series resonators among the two or more series resonators.

2. The multiplexer according to claim 1, wherein a number of the first electrode fingers included in the series resonator nearest to the common terminal among the two or more series resonators is smaller than a number of the first electrode fingers included in each of the other one or more series resonators.

3. The multiplexer according to claim 1, wherein
   the IDT electrode of the series resonator nearest to the common terminal among the two or more series resonators does not include the first electrode fingers; and
   the IDT electrode of each of the other one or more series resonators includes the first electrode fingers.

4. The multiplexer according to claim 1, wherein the first filter has a ladder filter structure including the two or more series resonators and the one or more parallel resonators.

5. The multiplexer according to claim 1, wherein the first filter further has a longitudinally coupled filter structure disposed on the first path.

6. The multiplexer according to claim 1, wherein the substrate includes:
   the piezoelectric layer including one main surface on which the IDT electrode is provided;
   a high-acoustic-velocity supporting substrate through which a bulk wave propagates at an acoustic velocity higher than an acoustic velocity of an elastic wave that propagates through the piezoelectric layer;
   a low-acoustic-velocity film through which the bulk wave propagates at an acoustic velocity lower than the acoustic velocity of the elastic wave that propagates through the piezoelectric layer; and
   the low-acoustic-velocity film is disposed between the high-acoustic-velocity supporting substrate and the piezoelectric layer.

7. The multiplexer according to claim 1, wherein
   the multiplexer is defined by a first duplexer and a second duplexer;
   the first duplexer includes two filters including the first filter; and
   the second duplexer includes two filters including the second filter.

8. The multiplexer according to claim 1, wherein the first filter has a pass band that is an uplink frequency band in Band 3 of Long Term Evolution, and the second filter has a pass band that is an uplink frequency band in Band 1 of the Long Term Evolution.

9. A radio-frequency front-end circuit comprising:
   the multiplexer according to claim 1; and
   an amplification circuit connected to the multiplexer.

10. The radio-frequency front-end circuit according to claim 9, wherein a number of the first electrode fingers included in the series resonator nearest to the common terminal among the two or more series resonators is smaller than a number of the first electrode fingers included in each of the other one or more series resonators.

11. The radio-frequency front-end circuit according to claim 9, wherein
the IDT electrode of the series resonator nearest to the common terminal among the two or more series resonators does not include the first electrode fingers; and
the IDT electrode of each of the other one or more series resonators includes the first electrode fingers.

12. The radio-frequency front-end circuit according to claim 9, wherein the first filter has a ladder filter structure including the two or more series resonators and the one or more parallel resonators.

13. The radio-frequency front-end circuit according to claim 9, wherein the first filter further has a longitudinally coupled filter structure disposed on the first path.

14. The radio-frequency front-end circuit according to claim 9, wherein the substrate includes:
the piezoelectric layer including one main surface on which the IDT electrode is provided;
a high-acoustic-velocity supporting substrate through which a bulk wave propagates at an acoustic velocity higher than an acoustic velocity of an elastic wave that propagates through the piezoelectric layer;
a low-acoustic-velocity film through which the bulk wave propagates at an acoustic velocity lower than the acoustic velocity of the elastic wave that propagates through the piezoelectric layer; and
the low-acoustic-velocity film is disposed between the high-acoustic-velocity supporting substrate and the piezoelectric layer.

15. The radio-frequency front-end circuit according to claim 9, wherein
the multiplexer is defined by a first duplexer and a second duplexer;
the first duplexer including two filters including the first filter; and
the second duplexer including two filters including the second filter.

16. The radio-frequency front-end circuit according to claim 9, wherein the first filter has a pass band that is an uplink frequency band in Band 3 of Long Term Evolution, and the second filter has a pass band that is an uplink frequency band in Band 1 of the Long Term Evolution.

17. A communication device comprising:
a radio-frequency signal processing circuit that processes a radio-frequency signal that is transmitted and received by an antenna element; and
the radio-frequency front-end circuit according to claim 9 that transmits the radio-frequency signal between the antenna element and the radio-frequency signal processing circuit.

18. The communication device according to claim 17, wherein a number of the first electrode fingers included in the series resonator nearest to the common terminal among the two or more series resonators is smaller than a number of the first electrode fingers included in each of the other one or more series resonators.

19. The communication device according to claim 17, wherein
the IDT electrode of the series resonator nearest to the common terminal among the two or more series resonators does not include the first electrode fingers; and
the IDT electrode of each of the other one or more series resonators includes the first electrode fingers.

20. The communication device according to claim 17, wherein the first filter has a ladder filter structure including the two or more series resonators and the one or more parallel resonators.

* * * * *